(12) United States Patent
Biber

(10) Patent No.: US 10,031,193 B2
(45) Date of Patent: Jul. 24, 2018

(54) LOCAL SAR BEHAVIOR OF MRI TRANSMISSION COILS BY USE OF ORTHOGONAL LOOP ANTENNAS

(71) Applicant: Stephan Biber, Erlangen (DE)

(72) Inventor: Stephan Biber, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 633 days.

(21) Appl. No.: 14/622,868

(22) Filed: Feb. 14, 2015

(65) Prior Publication Data

US 2015/0234019 A1 Aug. 20, 2015

(30) Foreign Application Priority Data

Feb. 14, 2014 (DE) .................. 10 2014 202 716

(51) Int. Cl.
| | | |
|---|---|---|
| *G01V 3/00* | (2006.01) | |
| *G01R 33/34* | (2006.01) | |
| *G01R 33/28* | (2006.01) | |
| *G01R 33/3415* | (2006.01) | |
| *G01R 33/36* | (2006.01) | |

(52) U.S. Cl.
CPC ..... *G01R 33/34092* (2013.01); *G01R 33/288* (2013.01); *G01R 33/3415* (2013.01); *G01R 33/3614* (2013.01)

(58) Field of Classification Search
USPC .......................................... 324/318
See application file for complete search history.

(56) References Cited

U.S. PATENT DOCUMENTS

| | | | | |
|---|---|---|---|---|
| 4,721,913 A | * | 1/1988 | Hyde ................... | G01R 33/343 324/318 |
| 5,280,249 A | * | 1/1994 | Kess .................. | G01R 33/3678 324/318 |
| 5,500,596 A | * | 3/1996 | Grist ................ | G01R 33/34061 324/318 |
| 6,317,091 B1 | * | 11/2001 | Oppelt ................. | G01R 33/285 324/318 |
| 6,504,369 B1 | * | 1/2003 | Varjo ............... | G01R 33/34053 324/318 |
| 8,742,760 B2 | * | 6/2014 | Matschl ............. | G01R 33/3415 324/318 |
| 2004/0220469 A1 | * | 11/2004 | Jevtic ................... | G01R 33/341 600/422 |
| 2005/0127914 A1 | | 6/2005 | Eberler et al. | |

(Continued)

FOREIGN PATENT DOCUMENTS

DE 10314215 B4 11/2006

OTHER PUBLICATIONS

Yigitcan Eryaman et al.: Use of "dark modes" in a loop + dipole array to reduce SAR in 7T C-spine imaging, 21st Annual ISMRM Scientific Meeting and Exhibition 2013, Discovery, Innovation & Application—Advancing MR for Improved Health, vol. 2 of 6, p. 900, ISBN: 978-1-62993-102-9, ISSN: 1545-4428, 2013, US, Apr. 20, 2013.

*Primary Examiner* — Rodney Fuller
(74) *Attorney, Agent, or Firm* — Lempia Summerfield Katz LLC

(57) ABSTRACT

A local coil for a magnetic resonance imaging system includes at least one former antenna and at least one further antenna. The at least one former antenna is arranged orthogonally with respect to the at least one further antenna.

24 Claims, 4 Drawing Sheets

(56) References Cited

U.S. PATENT DOCUMENTS

| | | | |
|---|---|---|---|
| 2011/0270073 A1* | 11/2011 | Ardenkjaer-Larsen | ................... G01R 33/60 600/410 |
| 2012/0280687 A1* | 11/2012 | Popescu ................ | A61B 5/055 324/318 |
| 2012/0313645 A1* | 12/2012 | Biber ................ | G01R 33/3692 324/322 |
| 2013/0063145 A1* | 3/2013 | Wiggins ............ | G01R 33/4802 324/309 |
| 2013/0127463 A1* | 5/2013 | Matschl ................ | G01R 33/34 324/309 |
| 2015/0130466 A1* | 5/2015 | Lips .................... | G01R 33/422 324/322 |

* cited by examiner

LOCAL SAR BEHAVIOR OF MRI TRANSMISSION COILS BY USE OF ORTHOGONAL LOOP ANTENNAS

This application claims the benefit of DE 10 2014 202 716.0, filed on Feb. 14, 2014, which is hereby incorporated by reference in its entirety.

BACKGROUND

The present embodiments relate to devices for SAR optimization.

Magnetic resonance imaging (MRI) apparatuses for examining objects or patients by magnetic resonance imaging are known, for example, from DE 103 14 215 B4 and "Use of 'dark modes' in a loop+dipole array to reduce SAR in 7T C-spine imaging," Yigitcan Eryaman1.2, Elfar Adalsteinsson and Lawrence L. Wald, ISMRM, 2013.

SUMMARY

The scope of the present invention is defined solely by the appended claims and is not affected to any degree by the statements within this summary.

The present embodiments may obviate one or more of the drawbacks or limitations in the related art. For example, SAR optimization is provided.

DETAILED DESCRIPTION

Figure 9:
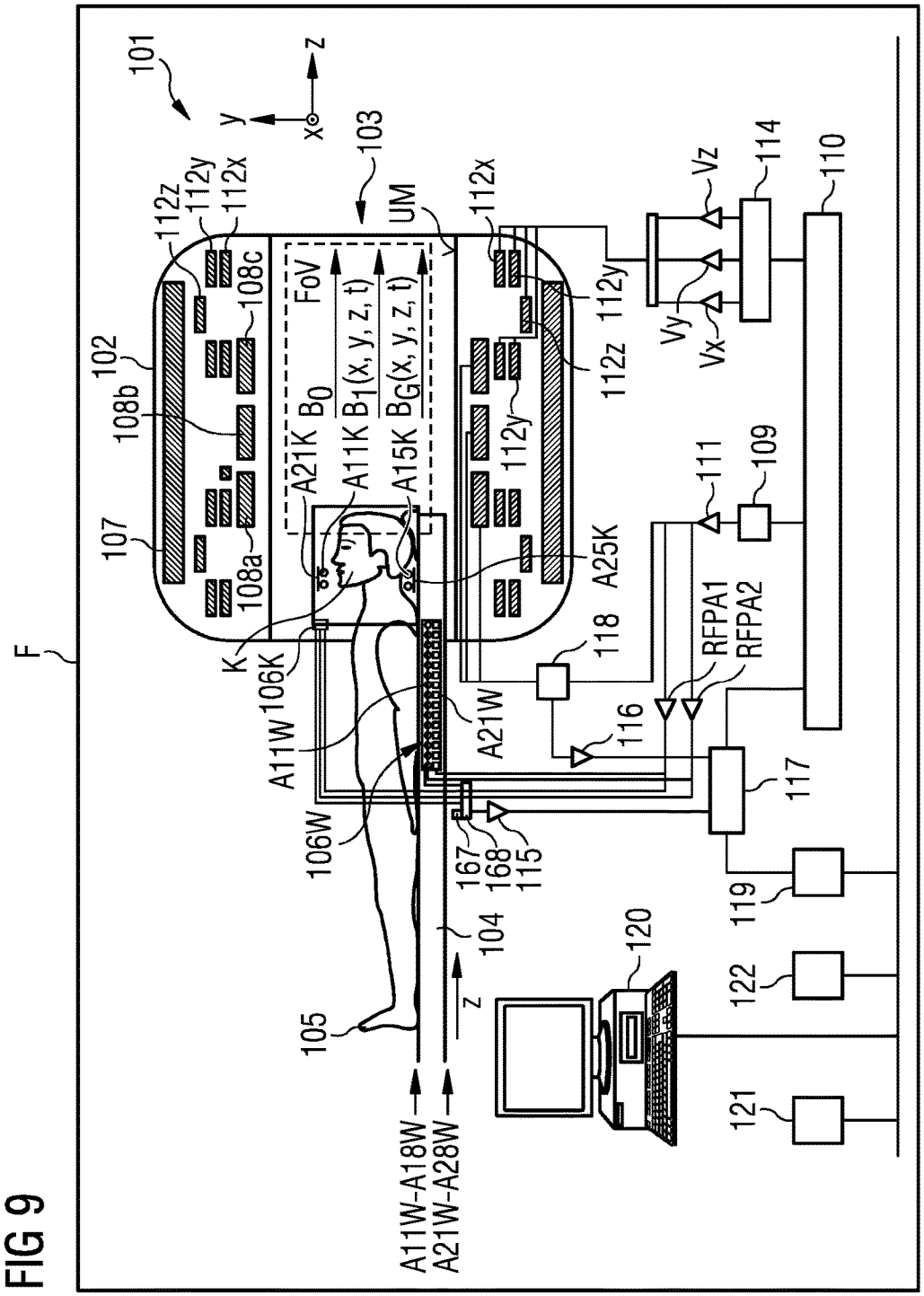
FIG. 9 schematically shows one embodiment of an MRI system including local coils.

FIG. 9 shows one embodiment of a magnetic resonance imaging apparatus MRI 101 (e.g., situated in a shielded area or Faraday cage F) including a hollow cylinder 102 with, for example, a tubular space 103, into which a patient couch 104 with a body (e.g., of an examination object 105 (a patient; with or without a local coil arrangement 106K, 106W) may be moved in the direction of the arrow z in order to generate recordings of the patient 105 using an imaging method. The local coil arrangement 106K, 106W is, for example, arranged on the patient and may be used to generate, in a local region (e.g., a field of view (FOV)) of the MRI, recordings of a partial region of the body 105 in the FOV. Signals of the local coil arrangement (e.g., 106K for an imaging of the head K and/or of a knee and/or of extremities and/or 106W for imaging of the spinal column) may be evaluated (e.g., converted into images, stored or displayed) by an evaluation device (e.g., including elements 168, 115, 117, 119, 120, 121) of the MRI apparatus 101. The evaluation device may be connected to the local coil arrangement 106K, 106W (e.g., via coaxial cables or by radio (element 167)).

In order to use a magnetic resonance imaging apparatus MRI 101 to examine a body 105 (e.g., an examination object or a patient) by magnetic resonance imaging, various magnetic fields coordinated very accurately with one another in terms of temporal and spatial characteristic are radiated onto the body 105. A strong magnet (e.g., a cryomagnet 107) in a measuring cabin having an opening 103 (e.g., in the form of a tunnel) generates a static strong main magnetic field $B_0$ that has, for example, a value of 0.2 tesla to 3 teslas or even more. A body 105 to be examined is laid on a patient couch 104 and moved into a region of the main magnetic field $B_0$ that is approximately homogeneous in the field of view FOV. The nuclear spins of atomic nuclei of the body 105 are excited by magnetic radio-frequency excitation pulses B1(x, y, z, t) that are radiated in by a radio-frequency antenna (and/or, if appropriate, a local coil arrangement). The radio-frequency antenna is illustrated in a very simplified fashion as body coil 108 (e.g., multipart body coil 108a, 108b, 108c). Radio-frequency excitation pulses are generated by a pulse generating unit 109, for example, which is controlled by a pulse sequence control unit 110. After amplification by a radio-frequency amplifier 111, the radio-frequency excitation pulses are conducted to the radio-frequency antenna 108. The radio-frequency system shown is merely indicated schematically. More than one pulse generating unit 109, more than one radio-frequency amplifier 111 and a plurality of radio-frequency antennas 108 a, b, c may also be used in a magnetic resonance imaging apparatus 101.

The magnetic resonance imaging apparatus 101 has gradient coils 112x, 112y, 112z, by which magnetic gradient fields $B_G$(x, y, z, t) for selective slice excitation and for spatial encoding of the measurement signal are radiated in during a measurement. The gradient coils 112x, 112y, 112z are controlled by a gradient coil control unit 114 (and, if appropriate, by amplifiers Vx, Vy, Vz), which, like the pulse generating unit 109, is connected to the pulse sequence control unit 110.

Signals emitted by the excited nuclear spins (of the atomic nuclei in the examination object) are received by the body coil 108 and/or at least one local coil arrangement 106K, 106W, amplified by assigned radio-frequency preamplifiers 116 and processed further and digitized by a receiving unit 117. The recorded measurement data are digitized and stored as complex numerical values in a k-space matrix. From the k-space matrix occupied by values, an associated MR image may be reconstructed by a multidimensional Fourier transformation.

For a coil that may be operated both in the transmission mode and in the reception mode, such as, for example, the body coil 108 or a local coil 106K, 106W, the correct signal forwarding is regulated by a transmission/reception switch 118 connected upstream.

An image processing unit 119 generates an image from the measurement data. The image is displayed to a user by an operating console 120 and/or is stored in a storage unit 121. A central computer unit 122 controls the individual installation components.

In MR imaging, images with a high signal/noise ratio (SNR) may be recorded by local coils (e.g., coils). These are antenna systems that are fitted in direct proximity on (anterior) or under (posterior) or at or in the body 105. During an MR measurement, the excited nuclei induce a voltage in the individual antennas (e.g., transmitting antennas) of the local coil. The induced voltage is then amplified by a low-noise preamplifier (LNA, preamp) and is finally forwarded to the reception electronics. In order to improve the signal/noise ratio even in the case of high resolution images, use is made of high-field installations (e.g., 1.5 T-12 T or more). If the number of individual antennas that may be connected to an MR reception system is more than the number of receivers present (e.g., a switching matrix (RCCS)) is incorporated between reception antennas and receivers. The switching matrix routes the instantaneously active reception channels (e.g., the reception channels that currently lie in the field of view of the magnet) to the receivers present. As a result, more coil elements than the number of receivers present may be connected, since, in the case of whole body coverage, only the coils that are situated in the FOV or in the homogeneity volume of the magnet are read out.

Local coil arrangement 106K, 106W, for example, generally denotes an antenna system that may include one antenna or, as an array coil, a plurality of antennas (e.g., coil elements or antenna elements). These individual antennas A11K-A18K, A21K-A 28K; A11W-A18W, A21W-A28W are embodied, for example, in each case as a loop antenna (e.g., loop), butterfly, flexible coil or saddle coil. A local coil arrangement includes, for example, coil elements, a preamplifier, further electronics (e.g., standing wave traps, etc.), a housing, supports and at least one cable with plug, by which the local coil arrangement is connected to the MRI installation. A receiver 168 fitted to the installation filters and digitizes a signal received from a local coil 106K, 106W (e.g., by radio) and transfers the data to a digital signal processing device. The digital signal processing device may derive an image or spectrum from the data obtained by a measurement and makes the derived image or spectrum available to the user, for example, for subsequent diagnosis by the digital signal processing device and/or storage.

The use of local coils (LC) as local transmission coils in magnetic resonance imaging may have various advantages. Higher B1 peak values and/or higher B1 average values may be achieved. Applications requiring very high B1 values in a very short time (e.g., short echo times, "metal imaging": suppression of artifacts on implants, spectroscopy) may benefit from higher B1 peak values, for example. Local transmission coils may have advantages in limiting SAR if the local transmission coils apply the transmission field only to a dedicated part of the body (e.g., left knee) rather than to the whole body of an examination subject lying in a body coil. Limiting the transmission field and a different field profile may enable advantages in the protocol design (e.g., direction of the phase encoding) since convolutions from other body parts, which are not intended to be examined, may be suppressed to a greater extent, since no transmission field acts on the other body parts.

By way of example, a phase encoding direction in the z-direction of an MRI may manage with less phase oversampling during knee or head imaging, since the irradiation of a local knee coil or head coil (106K) may be lower in the z-direction.

These advantages apply both to local coils transmitting on one channel and to local coils transmitting on a plurality of channels.

Advantages of local coils as locally transmitting coils may be: higher B1 peak; lower global SAR; and greater localization of the field profiles for more expedient protocol selection or better orthogonality of the TX profiles (pTX). There is a disadvantage, however, when using local coils as locally transmitting coils. Depending on the antenna geometry, the driving (e.g., supply) and tissue properties of the examined object (e.g., of a patient), high local SAR values may occur in the case of local coils as locally transmitting coils that are fitted near to the object or patient.

The IEC standard (60601 $3^{rd}$ edition) distinguishes between two type of TX coils (e.g., transmission coils): volume transmission coils that generate a relatively homogeneous field profile and surface transmission coils that generate a greatly inhomogeneous field. Only the global SAR behavior is to be taken into consideration for the volume transmission coils, and the local SAR behavior is also to be taken into account again for the surface transmission coils.

According to the prior art, volume transmission coils are primarily used at clinical field strengths of up to 3 T. At field strengths starting from 7 T, surface transmission coils are also used for B1 homogenization.

For safe operation of these local coils, complex SAR simulation may be carried out, and/or verification measurements may be performed with phantoms, ex vivo tissue or with in vivo MR thermometry. These coils are limited with regard to use by virtue of the local SAR generated in human tissue.

In order to reduce the SAR, there are methods for driving a plurality of individual transmission channels (e.g., in the case of a local TX array) that reduce the electric field of one transmitting antenna partially by the electric field of the other transmitting antenna and generate the desired B1 profile. These calculations are very complex, since the tissue distribution is to be known. The electric field distribution is to be known, and a multi-parameter optimization is to be carried out using this information. The optimization (e.g., taking account of hardware limitations) is to optimize a plurality of target functions simultaneously to generate the desired B1 field (e.g., homogeneity) and to reduce the electric field and the SAR hotspots generated therefrom.

A significantly simpler (e.g., HW-based) method was described by "Use of 'dark modes' in a loop+dipole array to reduce SAR in 7 T C-spine imaging, Yigitcan Eryaman1.2," Elfar Adalsteinsson and Lawrence L. Wald, ISMRM, 2013. In that case, a loop antenna is combined with a dipole antenna. The loop antenna generates the main proportion of the B1+ field used for MR imaging. Since the dipole in the orientation used makes hardly any contribution to the MR-effective B1+ field, the electric fields generated may be used to reduce the local SAR maxima. This was investigated and demonstrated by a simulation in the cited paper. This approach may have a disadvantage, however. The matching (sll) of dipole antennas may be very load-dependent. Depending on the patient, therefore, the tuning/matching of the dipole may therefore be adjusted anew by a patient-adaptive matching system since otherwise too much power is lost as a result of back reflection (e.g., mismatch) and does not contribute to the generation of the desired electric fields.

FIGS. 1-9 illustrate details of configurations according to one or more of the present embodiments.

Figure 1:
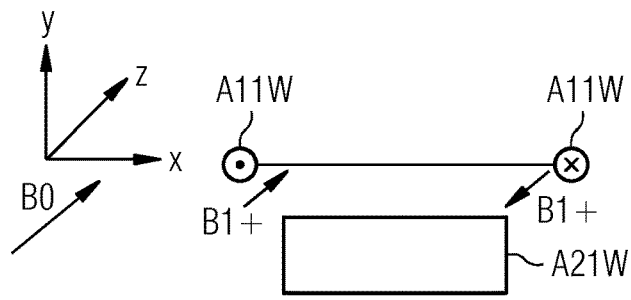
FIG. 1 shows in section in an xy-plane a former antenna and, arranged perpendicularly thereto, a further antenna of a local coil for a magnetic resonance imaging system, according to one embodiment.
Figure 2:
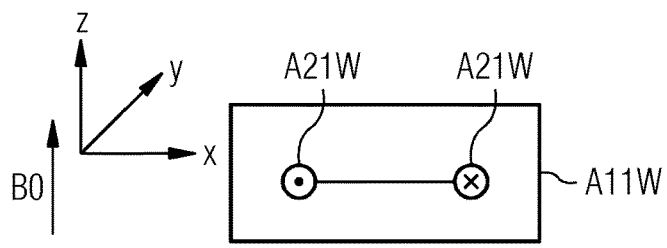
FIG. 2 shows in section in an xz-plane a former antenna and, arranged perpendicularly thereto, a further antenna of a local coil for a magnetic resonance imaging system, according to one embodiment.

As illustrated in FIG. 1, in section in an xy-plane and in FIG. 2 in section in an xz-plane, is at least one former antenna A11W (e.g., transmitting antenna) and, arranged perpendicularly thereto, at least one further antenna A21W (e.g., transmitting antenna) of a local coil (106K, 106W) for a magnetic resonance imaging system (101).

An arrangement may include antennas A11K-A18K, A21K-A28K; A11W-A18W, A21W-A28W in the form of loop antennas (e.g., loop coils), for example, that may be used as transmitting antennas in a manner connected to amplifiers RFPA, RFPA1, RFPA2 of transmitting device(s) and/or a splitter SPL in accordance with FIGS. 3, 4. The at least one former antenna A11K-A18K, A11W-A18W is intended to supply the majority (B1+) of the MR-effective (B1($x$, $y$, $z$, $t$)) field, and the at least one further antenna A21K-A28K; A21W-A28W generates no or a very small (MR-effective) B1+ field proportion. In this case, B1+ may be a contribution to the B1 field (in an MRI apparatus 101) that is supplied by an antenna of a local coil 106K, 106W.

As a result, the at least one former antenna A11K-A18K, A11W-A18W may be used for MR imaging, and the at least one further antenna may be used for improving the local SAR. Therefore, at least the former antenna A11K-A18K, A11W-A18W has an orientation that may pick up at least one field component of the circular field of the MR experiment. Further antenna A21K-A28K; A21W-A28W are arranged perpendicularly to the plane of the first antenna A11K-A18K, A11W-A18W.

The arrangement of the further antenna A21K-A28K; A21W-A28W may be advantageous, for example, such that the surface normal (z) thereof is aligned parallel to the B0 field of the MRI apparatus 101, as shown, for example, in FIG. 1.

Possible alignments are also illustrated in FIGS. 1-9. Possible application examples relate, for example, to local arrays (e.g., transmitting antenna arrays) Arr1, Arr2, Arr3, Arr4, Arr5, for a spinal column coil 106W or a head coil 106K or other local coil.

Figure 5:
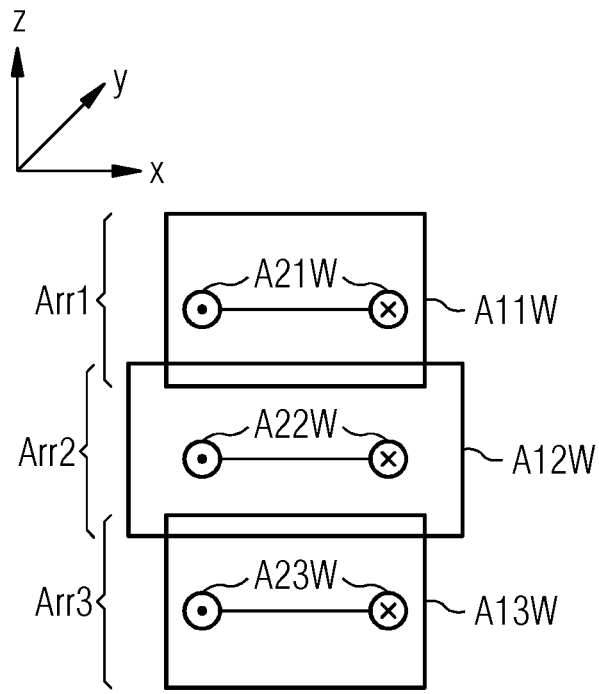
FIG. 5 shows a plurality of arrays of a local coil that each have exactly one former antenna and exactly one further antenna, according to one embodiment.
Figure 6:
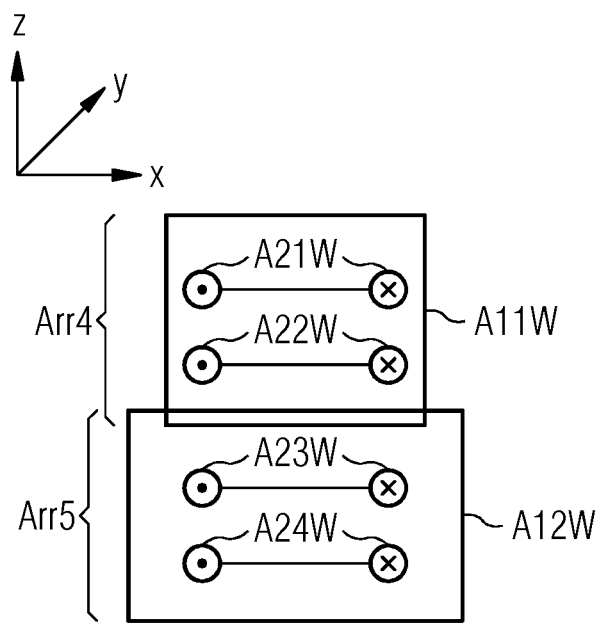
FIG. 6 shows a plurality of arrays of a local coil that each have exactly one former antenna and a plurality of further antennas, according to one embodiment.

As illustrated in FIGS. 5, 6, in an array Arr1, Arr2, Arr3, Arr4, Arr5 (e.g., also on a circuit board and/or as a spatially integrated arrangement, etc.), a plurality of antennas A11K-A18K, A21K-A28K; A11W-A18W, A21W-A28W may be provided. In this case, for each antenna A11K-A18K, A11W-A18W that generates a B1+ field proportion, there is arranged one or a plurality of non-MR-effective or less-MR-effective antennas A21K-A28K, A21W-A28W that contribute primarily to SAR reduction.

Using an arrangement of antennas A11K-A18K, A21K-A28K; A11W-A18W, A21W-A28W perpendicularly to one another, a good decoupling of the B1 antenna and the electric field antenna from one another may be achieved purely geometrically.

With regard to decoupling (e.g., two groups of antennas A11K-A18K, A21K-A 28K; A11W-A18W, A21W-A28W arise in an array), a number N of B1+ field generating antennas (type 1) A11K-A18K, A11W-A18W are assigned to a number M (e.g., M>=N) of electric field cancellation (e.g., electric field cancellation or compensation) antennas (type 2) A21K-A28K; A21W-A28W.

In the case of the decoupling, for example, either the direct or the direct and next but one neighbors of the antennas A11K-A18K, A21K-A28K; A11W-A18W, A21W-A28W from groups 1 and 2 may be decoupled. For reducing the complexity of arrays of antennas A11K-A18K, A21K-A28K; A11W-A18W, A21W-A28W having many elements, the decoupling matrices may be subdivided among antennas A11K-A18K, A21K-A28K; A11W-A18W, A21W-A28W of type 1 and type 2.

The supply of the antennas A11K-A18K, A21K-A28K; A11W-A18W, A21W-A28W may follow different architectures such as, for example, the following (number of individually controllable transmitters=X, N=number of B1+ field generating antennas (=type 1 antennas) A11K-A18K, A11W-A18W, M=number of electric field cancellation antennas (=type 2 antennas A21K-A28K, A21W-A28W)): All antennas A11K-A18K, A21K-A28K; A11W-A18W, A21W-A28W (also designated as coil elements) may be driven individually by an individually drivable transmitter (X=N+M).

Figure 3:
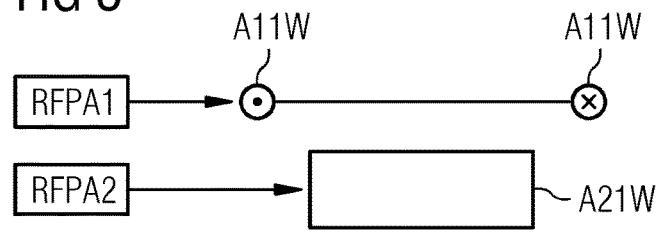
FIG. 3 shows a former antenna and, arranged perpendicularly thereto, a further antenna of a local coil that are driven in each case by a different transmitter, according to one embodiment.

FIG. 3 shows, by way of example, two antennas A11W, A21W at a respective transmitter (e.g., illustrated in the form of the amplifier RFPA1, RFPA2 of the transmitter).

FIG. 5 shows, by way of example, in each case, one antenna A11W and one antenna A21W of type 2 integrated jointly on an array Arr1 (e.g., module spatially).

Each antenna A11K-A18K, A11W-A18W of type 1 may be assigned one or a plurality of antennas A21K-A28K, A21W-A28W of type 2.

Figure 4:
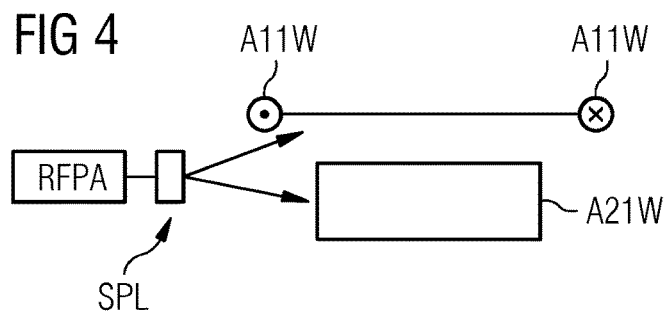
FIG. 4 shows a former antenna and, arranged perpendicularly thereto, a further antenna of a local coil that are driven in each case by the same amplifier of the same transmitter, according to one embodiment.

FIG. 4 shows, by way of example, two antennas A11W, A21W at a common transmitter (e.g., illustrated in the form of the amplifier RFPA of the transmitter) with a splitter.

FIG. 6 shows, by way of example, in each case, one antenna A11W and two antennas A21W, A22W of type 2 jointly integrated on an array Arr4 (e.g., module spatially).

For each of these antenna groups (e.g., in the form of arrays), there exists at least one transmitter RFPA, RFPA1, RFPA2. The transmission power may be divided (e.g., in the antenna or elsewhere) by a fixed or adjustable distribution network (X=N).

The N+M antennas may be supplied from X<N transmitters, and the division is effected via fixed or adjustable passive networks, where 1<X<N.

The N+M antennas may be supplied from one transmitter. The distribution is effected via a distribution network (X=1).

Figure 7:
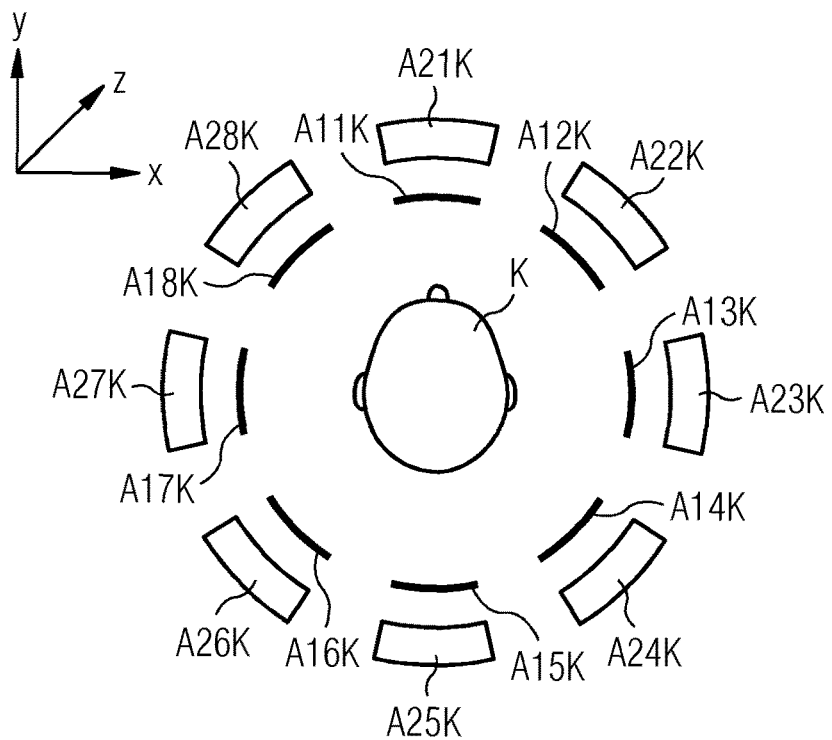
FIG. 7 shows in section in an xy-plane a local coil in the form of a head coil including former antennas and further antennas, according to one embodiment.

FIG. 7 shows in section in an xy-plane a local coil 106K for MR imaging at a head K with former antennas A11K-A18K and further antennas A21K-A28K.

The former antennas A11K-A18K are arranged, for example, on a radius around the space for the head K, and the further antennas A21K-A28K are likewise arranged here, on a smaller radius, around the space for the head K. The former antennas A11K-A18K are arranged (e.g., in a manner embodied as loop coils in an area) such that a surface normal and/or the B1 field generated by the former antennas A11K-A18K are/is parallel to the direction z of the basic field B0 of the MRI apparatus 101 (and/or to the direction z in which a patient couch 104 is introduced into the bore 103). The further antennas A21K-A28K are arranged (e.g., in a manner embodied as loop coils in an area) such that the field generated by the further antennas A21K-A28K is perpendicular to the field generated by the former antennas A11K-A18K.

Figure 8:
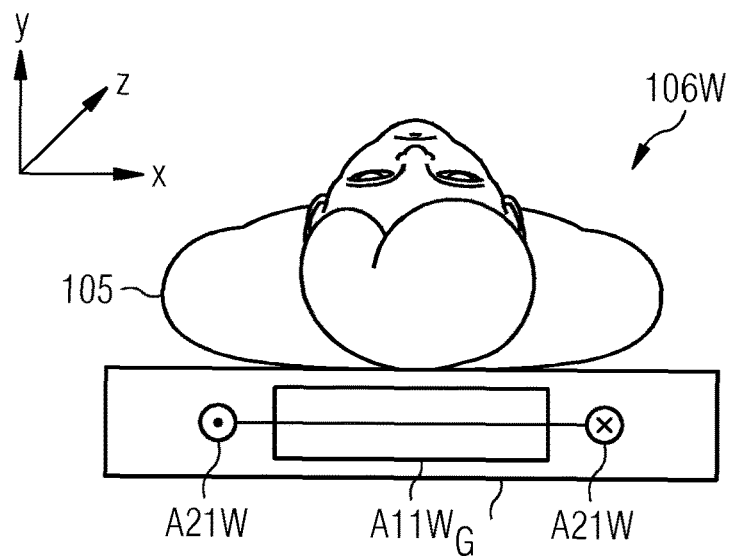
FIG. 8 shows in section in an xy-plane a local coil in the form of a spinal column coil including former antennas and further antennas.

FIG. 8 shows one embodiment of a local coil 106W in the form of a spinal column coil including a former antenna A11W visible in section and a further antenna A21W visible in section, which are arranged in and/or within the housing G of the spinal column coil.

The first antenna A11W is arranged (e.g., in a manner embodied as loop coils in an area) such that the surface normal thereof and/or the B1 field generated by the first antenna A11W is parallel to the direction z of the basic field B0 of the MRI apparatus 101 (and/or to the direction z in which a patient couch 104 is introduced into the bore 103).

The further antenna A21W is arranged (e.g., in a manner embodied as loop coils in an area) such that the field generated by the further antenna A21W is perpendicular to the field generated by the former antenna A11W.

FIG. 9 illustrates one embodiment of the local coil 106K and the local coil 106W both in longitudinal section in a manner situated in a position in a bore 103 of an MRI apparatus 101.

Possible advantages of configurations according to one or more of the present embodiments may be, for example, the following.

One advantage may be the improvement of the local SAR properties of transmitting antennas and transmitting antenna arrays (e.g., local) by the use of further transmitting antennas that do not generate an MR-effective B1 field, but rather are intended primarily to reduce the electric fields of the first antenna.

Some or all of the antennas may be embodied as loop antennas (e.g., resonant antennas), as a result of which the sensitivity of the matching (s 11) to a variable patient load, and thus, the efficiency of the local SAR reduction may be improved compared with variants discussed in the introduction.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance imaging system, the local coil comprising:
   at least one former antenna and at least one further antenna,
   wherein the at least one former antenna is arranged orthogonally with respect to the at least one further antenna, and
   wherein the local coil is arranged in a bore of a magnetic resonance imaging system such that the at least one further antenna of the local coil is arranged so that a surface normal of the at least one further antenna is arranged parallel to a direction of a basic magnetic field in the bore of the magnetic resonance imaging system.

2. The local coil of claim 1, wherein the at least one former antenna comprises a plurality of former antennas, and the at least one further antenna comprises a plurality of further antennas, and
   wherein the plurality of former antennas are arranged orthogonally with respect to the plurality of further antennas.

3. The local coil of claim 1, wherein the at least one former antenna is arranged orthogonally with respect to the at least one further antenna in order to enable an optimization of a local SAR behavior of the local coil.

4. The local coil of claim 1, wherein some or all antennas of the at least one former antenna and the at least one further antenna are loop antennas, and
   wherein an area in which the at least one former antenna is arranged is orthogonal with respect to an area in which the at least one further antenna is arranged.

5. The local coil of claim 1, wherein the at least one former antenna is arranged in a plane having a surface normal that is arranged perpendicularly or horizontally and perpendicularly to a longitudinal direction of a patient couch, to a longitudinal direction of a bore of the magnetic resonance imaging system during imaging in the bore of the magnetic resonance imaging system, or a combination thereof.

6. The local coil of claim 1, wherein the at least one further antenna of the local coil is arranged in a plane having a surface normal that is arranged horizontally and in a longitudinal direction of a patient couch, with respect to a longitudinal direction of a bore of the magnetic resonance imaging system during imaging in the bore of the magnetic resonance imaging system, or a combination thereof.

7. The local coil of claim 1, wherein some or all antennas of the at least one former antenna and the at least one further antenna are also receiving antennas, are connected to a receiving device of the magnetic resonance imaging system, or a combination thereof.

8. The local coil of claim 1, wherein the local coil is a head coil comprising the at least one former antenna and the at least one further antenna.

9. The local coil of claim 1, wherein the local coil is a spinal column coil comprising the at least one former antenna and the at least one further antenna.

10. The local coil of claim 1, wherein the local coil comprises an array, the array comprising the at least one former antenna and the at least one further antenna.

11. The local coil of claim 1, further comprising a plurality of arrays, each array of the plurality of arrays comprising at least one former antenna and at least one further antenna,
    wherein the at least one former antenna of the respective array is arranged orthogonally with respect to the at least one further antenna of the respective array.

12. The local coil of claim 1, further comprising a plurality of arrays, each array of the plurality of arrays comprising exactly one former antenna and exactly one further antenna,
    wherein the one former antenna is arranged orthogonally with respect to the one further antenna.

13. The local coil of claim 1, further comprising a plurality of arrays, each array of the plurality of arrays comprising exactly one former antenna and a plurality of further antennas,
    wherein the one former antenna is arranged orthogonally with respect to the plurality of further antennas.

14. The local coil of claim 1, wherein direct or direct and next but one neighbors of the at least one former antenna are decoupled from one another.

15. The local coil of claim 1, wherein direct or direct and next but one neighbors of the at least one further antenna are decoupled from one another.

16. The local coil of claim 1, wherein the at least one former antenna, the at least one further antenna, or the at least one former antenna and the at least one further antenna of the local coil are provided as transmitting antenna for transmission, are connectable to a transmitting arrangement of the magnetic resonance imaging system, or a combination thereof.

17. The local coil of claim 16, wherein the at least one former antenna, the at least one further antenna, or the at least one former antenna and the at least one further antenna of the local coil are connectable to an amplifier, a splitter, or the amplifier and the splitter of the magnetic resonance imaging system.

18. The local coil of claim 1, wherein all former antennas of the at least one former antenna and all further antennas of the at least further antenna are driven individually in each case by a transmitter.

19. The local coil of claim 1, wherein in each case one former antenna and at least one further antenna are driven jointly by a transmitter.

20. The local coil of claim 1, wherein the at least one former antenna and the at least one further antenna are driven by fewer transmitters than former antennas are provided, and wherein transmission energy is divided via fixed or adjustable passive networks.

21. The local coil of claim 1, wherein all former antennas of the at least one former antenna and all further antennas of the at least one further antenna are driven together by overall only one transmitter, and wherein transmission energy is divided via a distribution network.

22. The local coil of claim 21, wherein the transmitter comprises an amplifier connected to a device for generating signals to be transmitted, in particular radiofrequency signals.

23. The local coil of claim 22, wherein the signals are radio-frequency signals.

24. A magnetic resonance imaging system comprising:
a local coil comprising:
at least one former antenna and at least one further antenna,
wherein the at least one former antenna is arranged orthogonally with respect to the at least one further antenna, and
wherein the local coil is arranged in a bore of a magnetic resonance imaging system such that the at least one further antenna of the local coil is arranged so that a surface normal of the at least one further antenna is arranged parallel to a direction of a basic magnetic field in the bore of the magnetic resonance imaging system.

* * * * *